US006927106B2

(12) United States Patent
Chambers et al.

(10) Patent No.: US 6,927,106 B2
(45) Date of Patent: Aug. 9, 2005

(54) METHODS FOR FABRICATING A TRIPLE-GATE MOSFET TRANSISTOR

(75) Inventors: James Joseph Chambers, Dallas, TX (US); Mark Robert Visokay, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/696,539

(22) Filed: Oct. 29, 2003

(65) Prior Publication Data

US 2005/0095764 A1 May 5, 2005

(51) Int. Cl.$^7$ ............................................. H01L 21/00
(52) U.S. Cl. ..................... 438/157; 438/287; 257/331; 257/320
(58) Field of Search ............................... 438/157, 197, 438/287; 257/331, 320

(56) References Cited

U.S. PATENT DOCUMENTS

| 5,804,848 | A | 9/1998 | Mukai | |
|---|---|---|---|---|
| 5,899,710 | A | 5/1999 | Mukai | |
| 6,670,248 | B1 * | 12/2003 | Ang et al. | 438/287 |
| 6,716,684 | B1 * | 4/2004 | Krivokapic et al. | 438/157 |
| 6,727,546 | B2 * | 4/2004 | Krivokapic et al. | 257/331 |
| 2003/0136963 | A1 | 7/2003 | Krivokapic et al. | |

OTHER PUBLICATIONS

"25nm CMOS Omega FETs", IEEE, Fu-Liang Yang, Hao-Yu Chen, Fang-Cheng Chen, Chang-Chuan Huang, Chang-Yun Chang, Hsien-Krang Chiu, Chi-Chuang Lee, Chi-Chun Chen, Huan-Tsuang Huang, Chih-Jian Chen Hun-Jan Tao, Yee-Chia Yeo, Mong-Song Liang and Chenming Hu, 2002, 4 pgs.
"SOI Devices for Sub-0.1 µm Gate Lengths", PROC. 23$^{rd}$ International Conference on Microelectronics (Miel 2002), vol. 1, NIS, Yugoslavia, May 12-15, 2002, J.P. Colinge, J.T. Park and C.A. Colinge, pp. 109-113.
"Advanced Depleted-Substrate Transistors: Single-Gate, Double-Gate and Tri-Gate", 2002 International Conference on Solid State Devices and Materials (SSDM 2002, Nagoya, Japan, Robert Chau, Brian Doyle, Jack Kavalieros, Douglas Barlage, Anand Murthy, Mark Doczy, Rafail Rios, Tom Linton, Reza Arghavani, Ben Jin, Suman Datta and Scott Hareland, pp. 1-23.
"Beyond the Conventional Transistor", IBM J. Res. & Diev., vol. 46, No. 2/3, Mar./May 2002, H.-S.P. Wong, pp. 133-168.

* cited by examiner

Primary Examiner—Dung A. Le
(74) Attorney, Agent, or Firm—Jacqueline J. Garner; W. James Brady, III; Frederick J. Telecky, Jr.

(57) ABSTRACT

Fabrication methods are presented in which a semiconductor body is deposited in a cavity of a temporary form structure above a semiconductor starting structure. The formed semiconductor body can be epitaxial silicon deposited in the form cavity over a silicon substrate, and includes three body portions, two of which are doped to form source/drains, and the other forming a transistor channel that overlies the starting structure. A gate structure is formed along one or more sides of the channel body portion to create a MOS transistor.

10 Claims, 10 Drawing Sheets

METHODS FOR FABRICATING A TRIPLE-GATE MOSFET TRANSISTOR

RELATED APPLICATIONS

This application is related to U.S. patent application Ser. No. 10/696,130, filed on Oct. 29, 2003, entitled MULTIPLE GATE MOSFET DEVICE WITH LITHOGRAPHY INDEPENDENT SILICON BODY THICKNESS AND METHODS FOR FABRICATING THE SAME.

FIELD OF INVENTION

The present invention relates generally to semiconductor devices and more particularly to multi-gate MOSFET transistors and fabrication methods therefor.

BACKGROUND OF THE INVENTION

Metal-oxide-semiconductor field-effect transistors (MOSFETs) are widely used in the electronics industry for switching, amplification, filtering, and other tasks related to both analog and digital electrical signals. Conventional planar MOS transistors include a gate dielectric overlying a channel region at the upper surface of a silicon substrate and a gate electrode situated above the gate dielectric. Source and drain regions are formed in the substrate on either lateral side of the channel. In operation, the gate electrode is energized to create an electric field in the channel region of the substrate, thus inverting a thin portion of the channel conductive underneath the gate dielectric and allowing minority carriers to travel through the channel between the source/drains. The threshold voltage (Vt) of a transistor is the gate voltage value required to render the channel conductive by formation of an inversion layer (e.g., in which the concentration of minority carriers exceeds that of majority carriers) at the surface of the semiconductor channel under the gate.

Scaling is a continuing process in the manufacture and design of semiconductor products, wherein electrical device feature sizes are being reduced to increase device density, improve performance (e.g., increase switching speed), and to reduce power consumption. For instance, it is desirable to scale or reduce the length of the transistor gate and hence the length of the channel between the source/drains, to increase drive current performance, particularly for operation with reduced gate voltages. The length of the gate structure is typically the smallest dimension in a planar transistor. However, lithography generally limits the extent to which transistor dimensions can be reliably scaled, wherein the minimum gate length is typically limited to the smallest dimension that can be reliably and repeatably patterned and etched using current photolithographic and etching techniques.

In addition to fabrication process limitations, performance limitations are also a barrier to scaling conventional planar transistor dimensions, particularly the gate length. For example, as the gate length is reduced, the transistor performance may be inhibited by short channel effects. In devices having long channel lengths, the gate voltage and the resulting field primarily control the depletion of charge under the gate. In shorter channel devices, however, the channel region is also affected by the source and drain voltages, leading to increased off-state current due to Vt roll off, degraded subthreshold slope, and degraded output current. In addition, since less gate voltage is needed to deplete the shortened channel, the barrier for electron injection from the source to the drain decreases, a situation sometimes referred to as drain induced barrier lowering (DIBL).

Figure 10A:
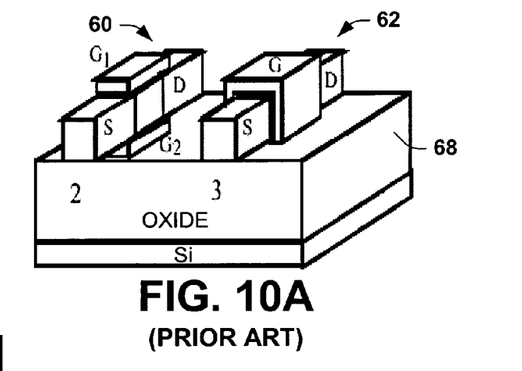
FIGS. 10A and 10B are simplified partial perspective views illustrating several conventional multi-gate transistor designs.
Figure 10B:
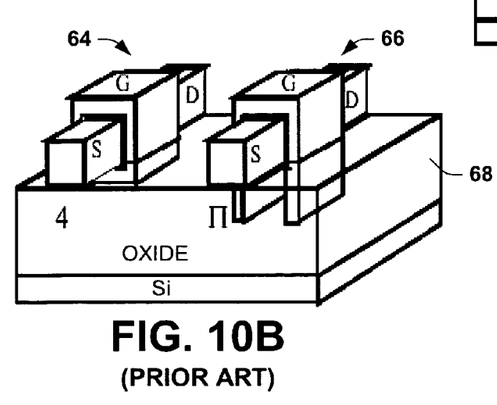

As the performance and process limitations on scaling planar transistors are reached, attention has been recently directed to transistor designs having multiple gates (e.g., non-planar MOS transistors). In theory, these designs provide more control over a scaled channel by situating the gate around two or more sides of the channel silicon, wherein a shorter channel length can be achieved for the same gate dielectric thickness or similar channel lengths can be used with thicker gate dielectrics. FIGS. 10A and 10B illustrate examples of some multiple-gate transistor designs, including dual and triple-gate transistors 60 and 62, respectively in FIG. 10A, as well as a quad-gate transistor 64, and a "PI"-gate transistor 66 in FIG. 10B, formed in a silicon over insulator (SOI) wafer 68. In conventional multi-gate devices, an SOI wafer is provided, which includes a substrate with an overlying oxide insulator and a 20.0–50.0 nm thick semiconductor layer above the oxide. The upper silicon layer is etched away, leaving isolated islands or blocks of silicon, and a gate is formed around the silicon blocks, with the ends of the blocks being doped to form source/drains, as illustrated in FIGS. 10A and 10B.

Multi-gate designs offer the prospect of improved transistor performance by alleviating the short channel effects seen in scaled planar transistors. This is due primarily to the ability to invert a larger portion of the channel silicon because the gate extends on more than one peripheral side of the channel. In practice, however, the conventional multi-gate approaches have suffered from cost and performance shortcomings, because SOI wafers are more expensive than ordinary silicon substrates and because the channel surface has been etched while carving the upper SOI silicon layer into islands or blocks. Accordingly, there remains a need for improved transistor devices and manufacturing techniques to realize the advantages of scaling while mitigating or avoiding short channel effects and the shortcomings of traditional multi-gate transistors.

SUMMARY OF THE INVENTION

The following presents a simplified summary in order to provide a basic understanding of one or more aspects of the invention. This summary presents one or more concepts of the invention in a simplified form as a prelude to the more detailed description that is presented later and is not an extensive overview of the invention. In this regard, the summary is not intended to identify key or critical elements of the invention, nor does the summary necessarily delineate the scope of the invention. The invention relates to multi-gate transistors and fabrication methods therefor, wherein the transistors are constructed using a semiconductor body formed above a starting structure, rather than by etching into an SOI wafer. This allows avoidance or mitigation of the adverse effects of etched channel surfaces, while attaining the advantages of multi-gate devices (e.g., inversion of more channel silicon, reduction in short channel effects, reduced DIBL, etc.), and allowing the use of less expensive starting structures (e.g., silicon wafer, etc.).

In accordance with one aspect of the present invention, a method is provided for fabricating a MOS transistor, comprising creating a form structure, such as by depositing and patterning a silicon nitride film to create an opening exposing a single portion of an underlying starting structure, where the starting structure can be a silicon substrate or other structure. The method further comprises forming a semiconductor material in the opening to create a formed semiconductor body above the starting structure, for example, depositing epitaxial silicon, epitaxial silicon germanium, epitaxial germanium, or epitaxial gallium arsenide in the form structure opening. The formed semiconductor body comprises first, second, and third body portions with the second body portion being disposed between the first and third body portions. The form structure is then removed and a gate structure is formed along at least a portion of one or more of the top and sides of the second body portion. The gate structure comprises a conductive gate electrode and a gate dielectric disposed between the gate electrode and the second body portion. The first and third body portions are then doped to form source/drains therein, with the second body portion operating as the transistor channel.

In another aspect of the invention, a transistor is provided, comprising a formed semiconductor body deposited over a starting structure with first, second, and third body portions, where the second body portion is situated over the starting material between the first and third body portions. The first and third body portions individually comprise doped source/drains, and a gate structure is provided along at least a portion of the top and sides of the second body portion. The gate structure comprises a conductive gate electrode and a gate dielectric disposed between the gate electrode and the second body portion, wherein the second body portion operates as the transistor channel between the doped source/drains. The channel in the second body portion has a channel length, a channel width and a channel depth, where the channel length, the channel width and the channel depth may be made generally equal, for example, wherein the channel length is about 25 nm or less. In one implementation, the transistor is a horizontal device, wherein the first, second, and third body portions are disposed in a plane generally parallel to a plane of the starting structure, where the body portions may be aligned along a horizontal axis. In this example, the starting structure comprises silicon and the formed semiconductor body comprises silicon, silicon germanium, germanium, or gallium arsenide deposited over the silicon starting structure.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIGS. 2A–9C are partial top plan and side elevation views in section illustrating a portion of a semiconductor device with an exemplary triple-gate MOSFET device in accordance with the invention, shown at various stages of fabrication processing.

DETAILED DESCRIPTION OF THE INVENTION

The present invention will now be described with reference to the attached drawing figures, wherein like reference numerals are used to refer to like elements throughout, and wherein the illustrated structures are not necessarily drawn to scale. The invention relates to transistor devices and fabrication methods wherein a semiconductor body is over a starting structure to allow multi-gate device fabrication using standard semiconductor wafers or other starting structures. In one example, illustrated and described below, the semiconductor body is formed in a cavity of a temporary form structure, through deposition of epitaxial silicon or other semiconductor material, after which the form structure is removed. The formed semiconductor body includes a single generally planar bottom surface situated over the starting material and has three body portions, two of which are doped to form source/drains, with the other body portion forming a transistor channel between the doped source/drains. A gate structure is formed along one or more of the top and lateral sides of the channel body portion to create a MOS transistor.

Figure 1:
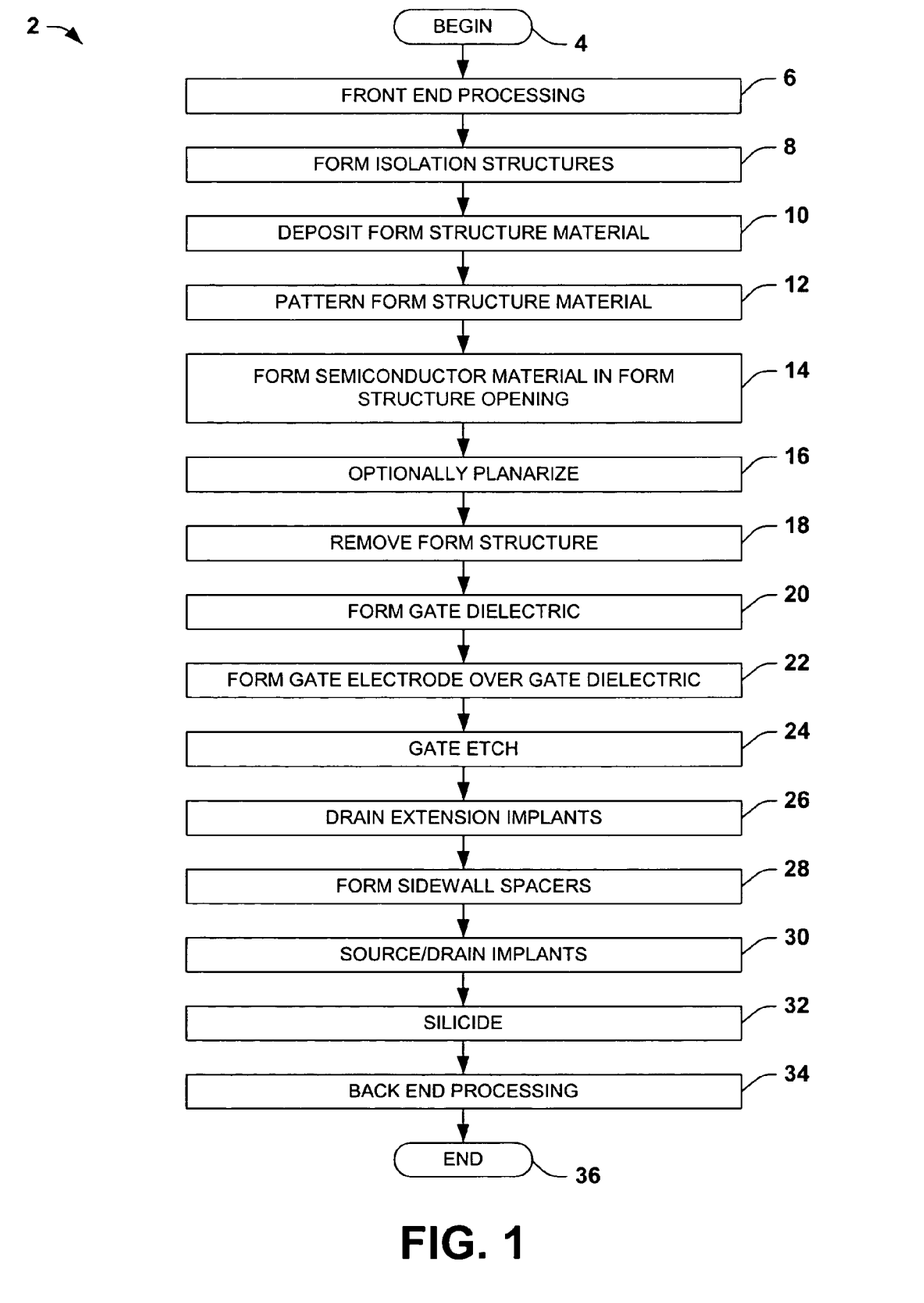
FIG. 1 is a flow diagram illustrating an exemplary method for fabricating a MOS transistor in accordance with the present invention.

FIG. 1 presents an exemplary method 2 for fabricating a transistor in accordance with the present invention. While the exemplary method 2 is illustrated and described herein as a series of acts or events, the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the formation and/or processing of structures illustrated and described herein (e.g., device 100 in FIGS. 2A–9C below) as well as in association with other structures and devices not illustrated.

Beginning at 4 in FIG. 1, the method 2 includes front end processing at 6, such as well formation and any other initial processing steps using a semiconductor substrate, SOI wafer, or other starting structure. At 8, isolation structures, such as silicon dioxide ($SiO_2$ field oxide) or other suitable isolating materials are formed in field regions of the starting structure, for example, using local oxidation of silicon (LOCOS), shallow trench isolation (STI) or other suitable processing techniques. A form or mold structure is then provided at 10 and 12 for subsequent use in forming a semiconductor material structure (e.g., a formed semiconductor body) above the starting structure. The form structure may be created using any suitable materials by any fabrication techniques within the scope of the invention.

In one possible implementation, silicon nitride (e.g., $Si_3N_4$) or other suitable form material is deposited at 10 over the starting structure and over the isolation structures by chemical vapor deposition (CVD), atomic layer deposition (ALD), or other deposition process, to a thickness generally corresponding to a desired final transistor gate length. The form layer material is then selectively patterned at 12, using suitable masking and etching techniques (e.g., reactive ion etching (RIE)), leaving an opening through which a single portion of the starting structure is exposed. Optionally, a thin (e.g., 50 Å or less) protective etch-stop layer, such as $SiO_2$, can be deposited over the starting structure and isolation structures prior to creation of the form structure at 10, which then protects the starting structure during patterning of the form structure at 12.

A formed semiconductor body is then created at 14–16 in the opening of the form structure, using any suitable semiconductor materials and formation techniques. In the illustrated example, a semiconductor material is formed at 14 in the opening of the patterned form layer material, for example, by epitaxial growth of silicon (Si), silicon germanium (SiGe), germanium (Ge), gallium arsenide (GaAs), or other suitable semiconductor material (e.g., epitaxial silicon 110 in the device 100 illustrated below). The epitaxial silicon can be formed in the opening in a variety of ways within the scope of the invention. The epitaxial growth can be performed either selectively or non-selectively to the exposed substrate. In the illustrated implementation, the epitaxial silicon is deposited at 14 selectively to the semiconductor substrate starting structure within the opening of the form structure. In another possible approach, a non-selective epitaxial deposition is performed, wherein epitaxial silicon is formed at 14 over the starting structure and in the form opening, after which the wafer is planarized at 16. In another possible implementation, a selective deposition can be terminated once the top of the form layer is reached, followed by a non-selective deposition that deposits both on the semiconductor body and the form layer, after which the device is planarized at 16.

An optional surface preparation, such as a wet clean, may be performed before epitaxial deposition or in-situ as part of an epitaxial deposition process to heal any damage to the surface, to remove any absorbed debris, and to remove any optional $SiO_2$ etch-stop layer material remaining over the starting material. Also, the epitaxial deposition at 14 may include a balance between etching of the underlying silicon starting structure and deposition of newly formed epitaxial silicon, wherein the pre-existing starting structure silicon may be initially etched prior to beginning deposition of new material, by which damage caused by patterning the form structure may be repaired. Following deposition of the semiconductor material, if needed, the wafer can optionally be planarized at 16, for example, by chemical mechanical polishing (CMP) or other suitable technique, leaving a generally planar structure having the form structure material exposed with the semiconductor body structure in the form structure opening above the starting material.

Thereafter, the form structure material is removed at 18, for example, by selective etching, or other suitable material removal technique, leaving the formed semiconductor body above the starting structure. In a preferred implementation, wet etching is employed at 18 to mitigate damage to the top and sides of the formed semiconductor body, for example, a wet etch process using a phosphoric acid wet clean which is selective both to a silicon formed semiconductor body and any optional $SiO_2$ etch-stop layer material that was previously deposited under the form layer. Compared with conventional multi-gate transistor fabrication processing in which dry etching (e.g., RIE) is used to carve blocks of semiconductor material from the upper layer of an SOI wafer, the formed semiconductor body of the present invention is not subjected to such damaging processing. In this regard, conventionally used dry etches result in build-up of polymer reside layers on the etched silicon surface that must be cleared off. Moreover, high-energy ions from reactive ion etching tend to bombard the surface in such prior processing, leading to crystalline damage at the top surface layer, and the etched material gets implanted with some of the species used as the etchant gas. In the present approach, wet etching with higher selectivity may be used, which is much less damaging than the dry etching that was done on the conventional case.

A gate dielectric is then formed at 20, for example, a thin $SiO_2$, SiON, high-k, or other dielectric material, via an oxidation growth or a deposition process, where the gate dielectric material is formed over portions of the exposed starting structure material and isolation structures and over the side and upper surfaces of the formed semiconductor body. At 22, a gate electrode material layer, such as polysilicon, metal, or other suitable material, is formed (e.g., deposited) above the gate dielectric, wherein the gate dielectric and electrode layers may be formed at 20 and 22, respectively, to any suitable thicknesses using any suitable deposition processes.

A gate etch is then performed at 24 to selectively remove portions of the gate electrode material, which may also remove portions of the gate dielectric material as well. Any suitable masking and etching processes may be employed at 24 (e.g., reactive ion etching, etc.) to pattern the gate layers, thereby creating a patterned transistor gate structure. In the exemplary device 100 illustrated and described below, the gate structure includes multiple gate segments or portions extending along portions of the top and lateral sides of the semiconductor body formed at 14–18. In this case, the covered portion of the formed semiconductor body will operate as a transistor channel, and the remaining portions of the formed semiconductor body will be doped to operate as source/drains in the completed transistor device.

A shallow drain extension dopant implantation is performed at 26 to introduce dopants into source/drain portions of the formed semiconductor body. The drain extension implant at 26 may also provide dopants to the gate electrode, for example, where the electrode is polysilicon, to render the gate electrode conductive. The patterned gate structure and the semiconductor body may then be encapsulated, for example, via a reoxidation (RE-OX) process that oxidizes the exposed semiconductor surfaces thereof or other suitable encapsulation materials and processes.

Sidewall spacers are then formed at 28 along the sidewalls of the encapsulated gate structure and the sidewalls of the formed semiconductor body. A source/drain implant is performed at 30 to provide further dopants to the source/drain portions of the formed semiconductor body (e.g., as well as to the gate structure for a polysilicon gate electrode), thereby further defining the source/drains of the multi-gate transistor. The source/drain implant and/or the drain-extension implant operations may be angled implants to fully define the source/drain regions of the formed semiconductor body. Silicide processing is performed at 32 to form a metal silicide gate contact above the gate electrode as well as source/drain silicide contacts over the source/drains, using any suitable silicidation processing, for example, deposition of nickel over the device and annealing, followed by removal of unreacted nickel. Interconnect metalization and other back-end processing is then performed at 34 to complete the fabrication of the device before the method 2 ends at 36.

Figure 2A:
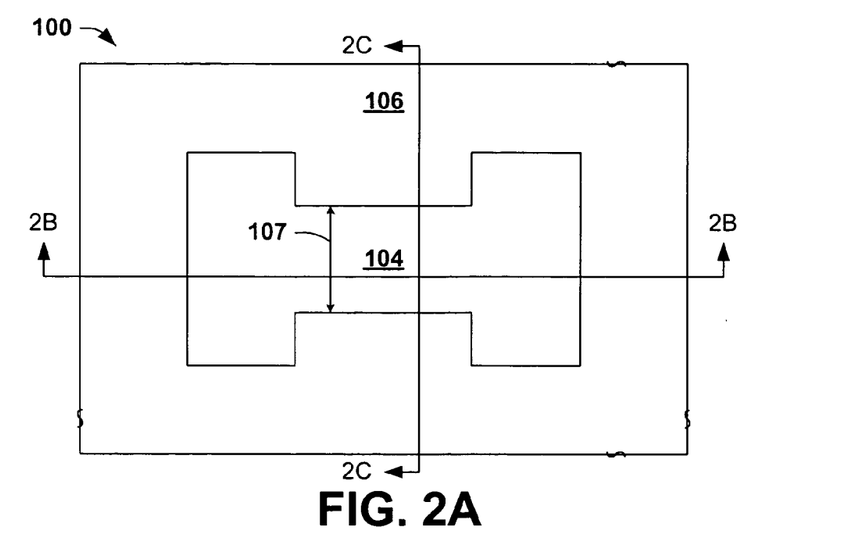
Figure 2B:
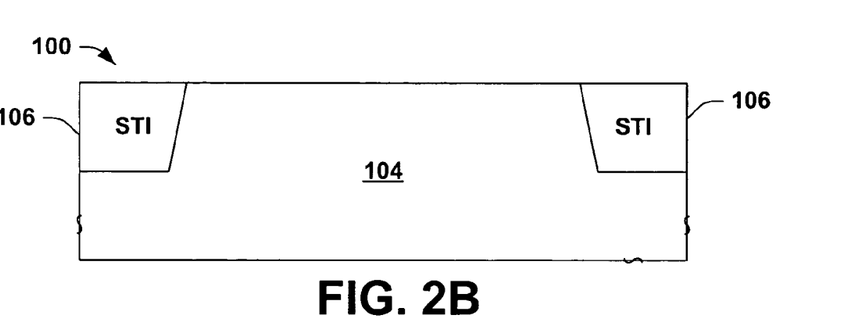
Figure 2C:
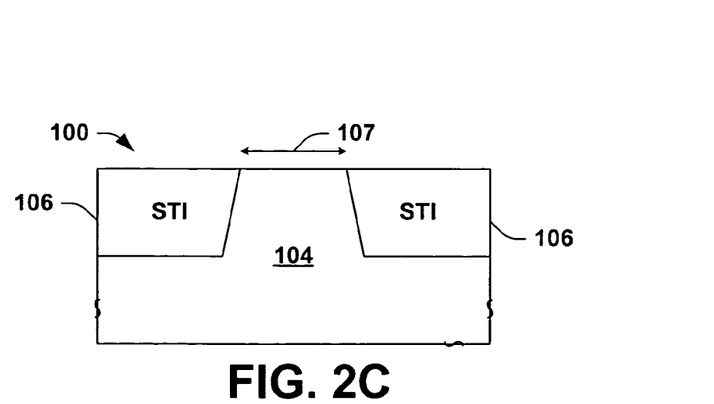

FIGS. 2A–9C illustrate an exemplary triple-gate MOS transistor in a semiconductor device 100 in accordance with the invention, undergoing processing at various stages of fabrication. FIGS. 2A, 3A, 4A, 5A, 6A, 7A, 8A, and 9A illustrate sectional top plan views of the device 100 and the other figures are side and end views as shown by the sections lines in the corresponding plan views. The exemplary device 100 is processed generally according to the method 2 described above, although transistors of the present invention may be fabricated by other methods. As shown in FIGS. 2A–2C, the device 100 of the present example comprises a silicon substrate 104 starting structure and $SiO_2$ STI isolation structures 106 formed in field regions of the substrate 104. The STI structures 106 are fabricated around the periphery of an "H"-shaped portion of the starting structure 104, as illustrated in the top plan view of FIG. 2A. The central portion of the H-shape has a width 107 of about 25 nm or less generally corresponding to a desired gate length for the subsequently fabricated triple-gate MOS transistor.

Figure 3A:
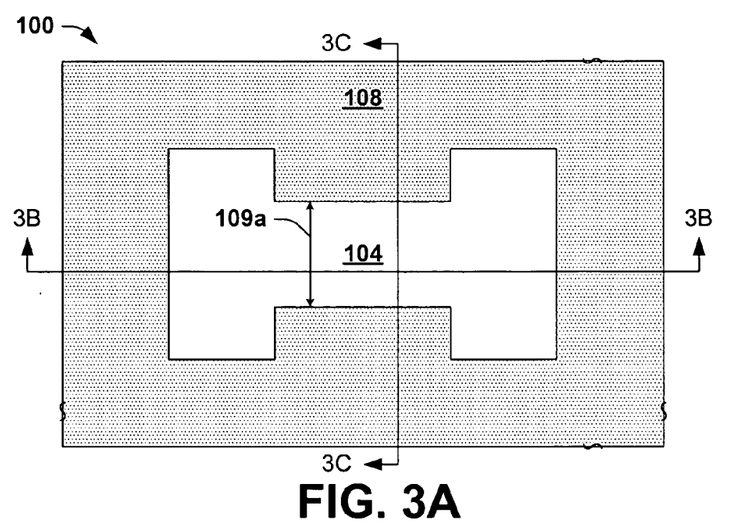
Figure 3B:
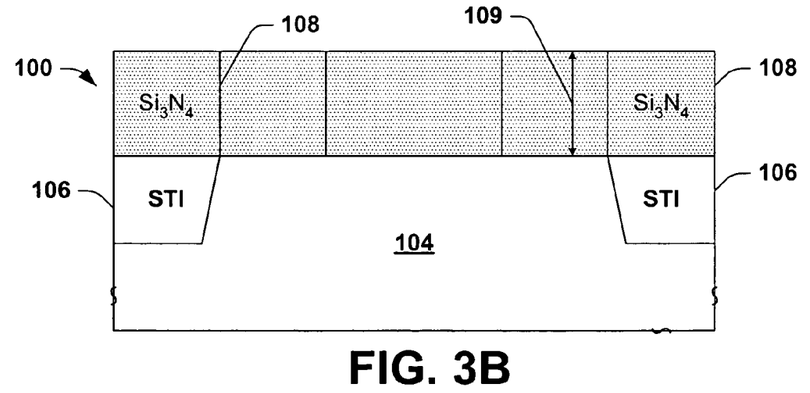
Figure 3C:
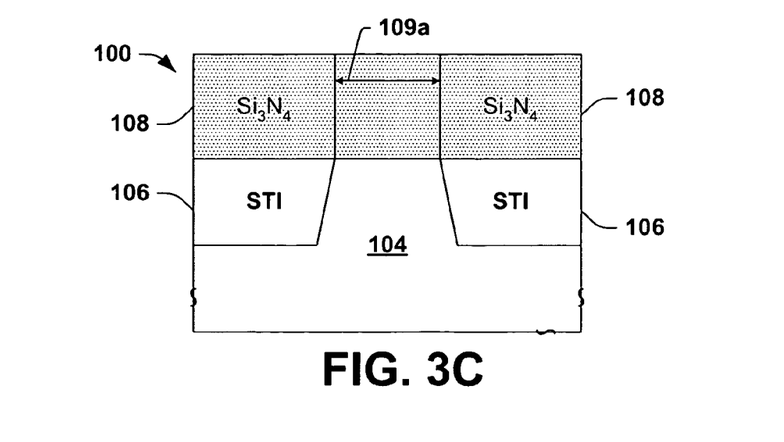

As illustrated in FIGS. 3A–3C, a silicon nitride form structure 108 is created above the substrate 104, which is generally aligned with the underlying STI structures 106. The form structure 108 may be created using any suitable materials by any fabrication techniques within the scope of the invention. In the illustrated implementation, silicon nitride (e.g., $Si_3N_4$) or other suitable material 108 is deposited over the substrate 104 and over the isolation structures 106 by chemical vapor deposition (CVD), atomic layer deposition (ALD), or other deposition process. The material 108 can be formed to any thickness 109, for example, where the deposition thickness 109 is generally the same as the desired final transistor gate length (e.g., about 25 nm or less). The form layer material 108 is then selectively patterned, using suitable masking and etching techniques, leaving an opening through which a single contiguous portion of the starting structure 104 is exposed.

Although the STI isolation structure 106 in the exemplary device 100 generally corresponds to the patterned form structure 108 (e.g., allowing use of the same or similar masks), alternative implementations are possible within the scope of the invention, in which the isolation structure 106 and the temporary form structures 108 do not correspond with one another. In the device 100, the patterned form structure 108 includes an "H"-shaped cavity or opening exposing the "H"-shaped portion of the underlying substrate starting structure 104, wherein the central portion of the opening has a width 109a generally equal to the thickness 109 and to the desired final transistor gate length. Other form structure opening shapes are possible within the scope of the invention, wherein the illustrated "H" shape advantageously provides reasonable semiconductor length, width, and depth dimensions for the resulting transistor channel, while also providing sufficient contact area for the source/drains thereof. However, the opening and the resulting formed semiconductor body may be of any shape within the scope of the invention, for example, including but not limited to rectangles, squares, etc.

Figure 4A:
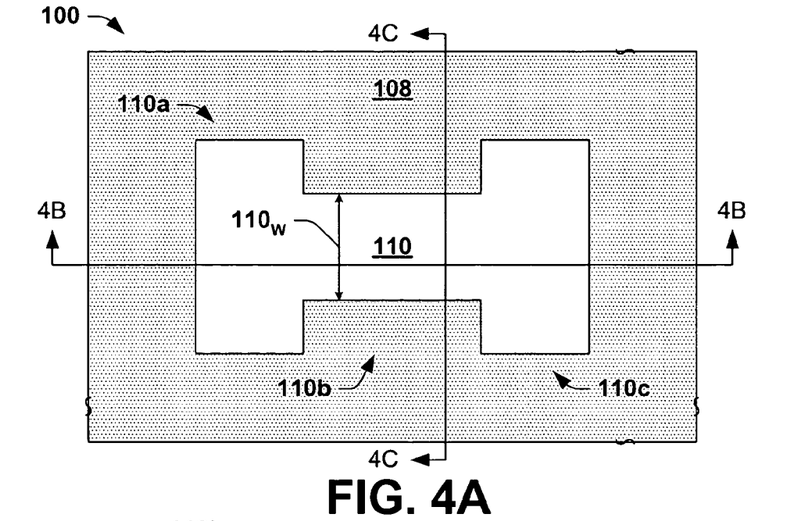
Figure 4B:
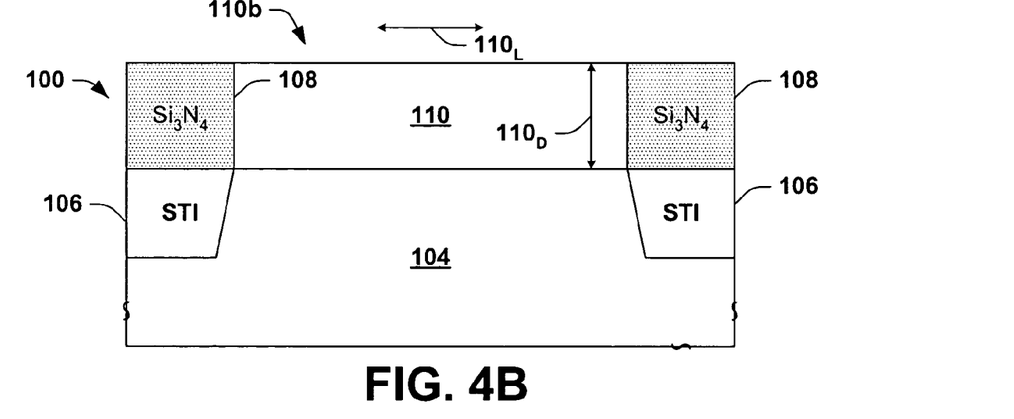
Figure 4C:
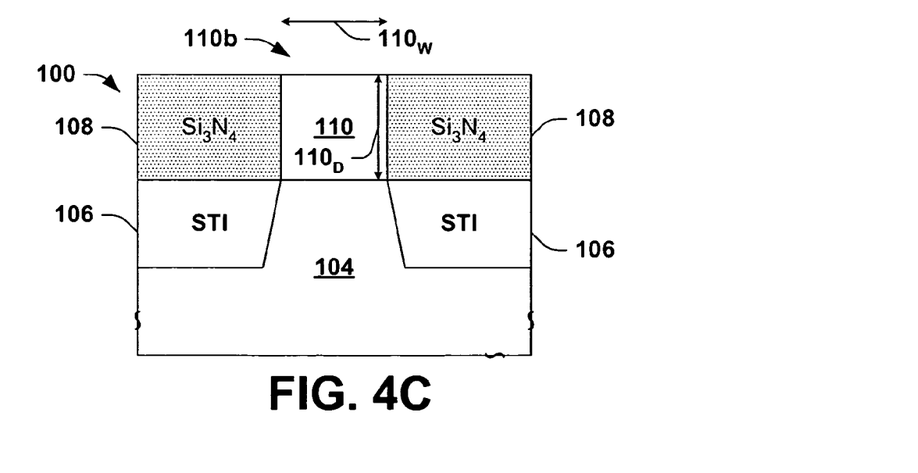

As illustrated in FIGS. 4A–4C, a formed semiconductor body 110 is then created in the opening of the form structure 108, using any suitable semiconductor materials and formation techniques. In the illustrated example, an epitaxial semiconductor material 110 is deposited by epitaxial growth processing in the form structure opening, for example, by formation of epitaxial silicon (Si), silicon germanium (SiGe), germanium (Ge), gallium arsenide (GaAs), or other suitable semiconductor material (e.g., epitaxial silicon 110 in the device 100). As discussed above with respect to FIG. 1, other implementations are possible in which the epitaxial semiconductor material is deposited over the starting structure 104 and over the patterned form layer material 106. In the latter approach, the device 100 can then be planarized, for example, by chemical mechanical polishing (CMP) or other suitable technique, leaving the device 100 as illustrated in FIGS. 4A–4C. Either approach provides a generally planar structure 100 having the silicon nitride form layer material 108 exposed with the semiconductor body structure 110 in the form structure opening.

As illustrated in FIGS. 4A–4C, the formed semiconductor body 110 includes first, second, and third body portions 110a, 110b, and 110c, respectively, extending downward from the planarized top surface to a single generally planar bottom surface above the starting structure 104. In this example, the body portions are disposed generally along a horizontal axis in a plane parallel to the plane of the substrate 104 to provide a horizontal transistor body. The first and third body portions 110a and 110c, respectively, will be subsequently doped to provide transistor source/drains, and a gate structure will be formed over portions of the top and sidewalls of the central second body portion 110b to provide a transistor channel therein that extends downward toward the starting structure 104. The channel of the second body portions 110b comprises a prospective channel length $110_L$, a channel width $110_W$, and a channel depth $110_D$, as shown in FIGS. 4A–4C, wherein the channel length $110_L$, channel width $110_W$, and channel depth $110_D$, are generally equal (e.g., about 25 nm or less in the device 100) in the illustrated implementation.

Figure 5A:
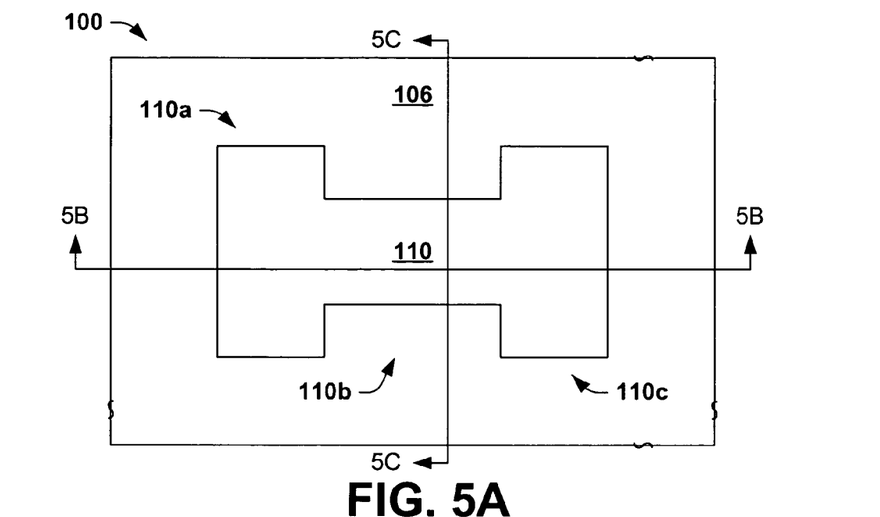
Figure 5B:
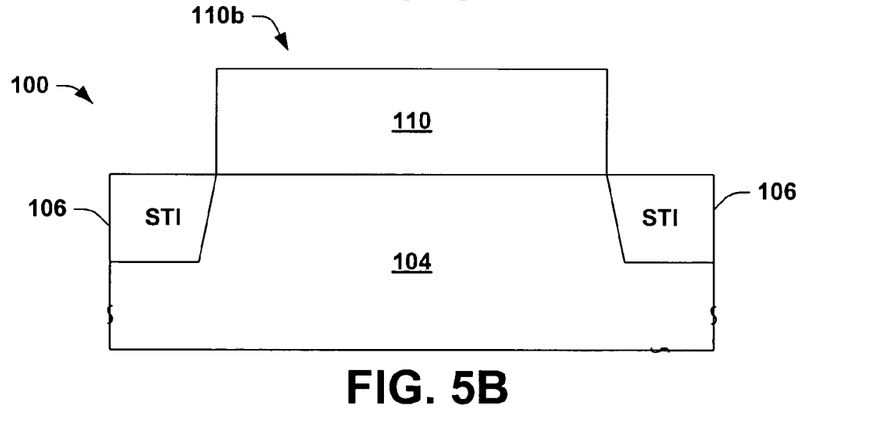
Figure 5C:
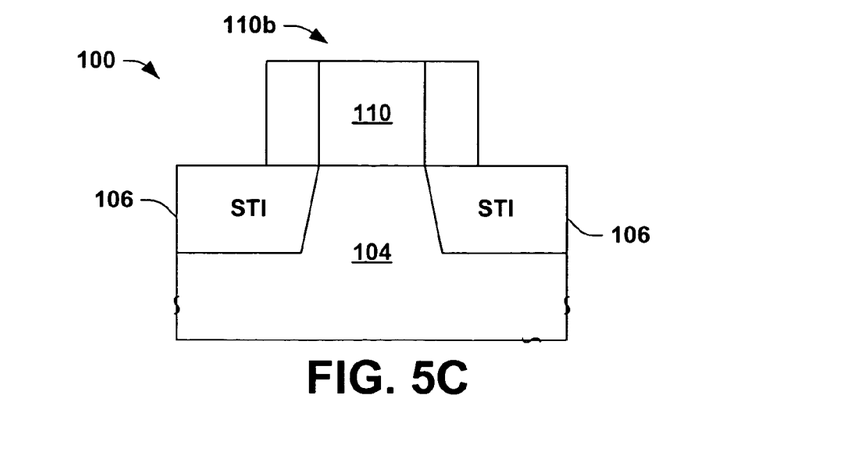
Figure 6A:
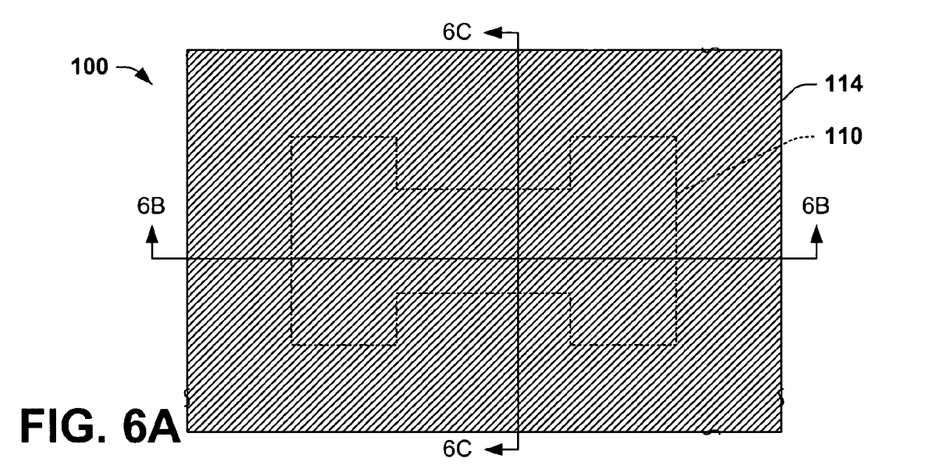
Figure 6B:
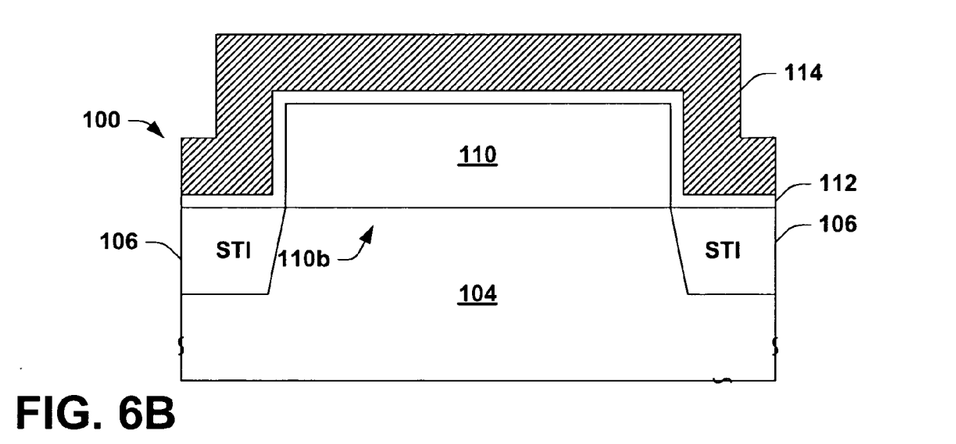
Figure 6C:
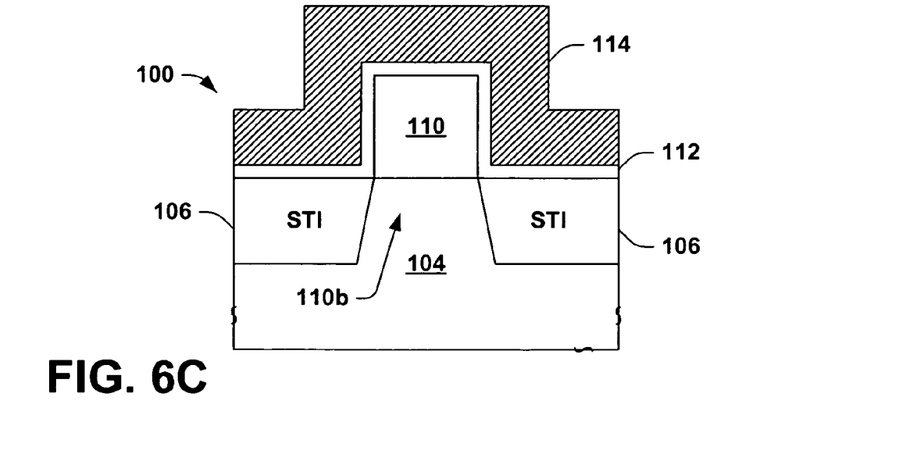
Figure 7A:
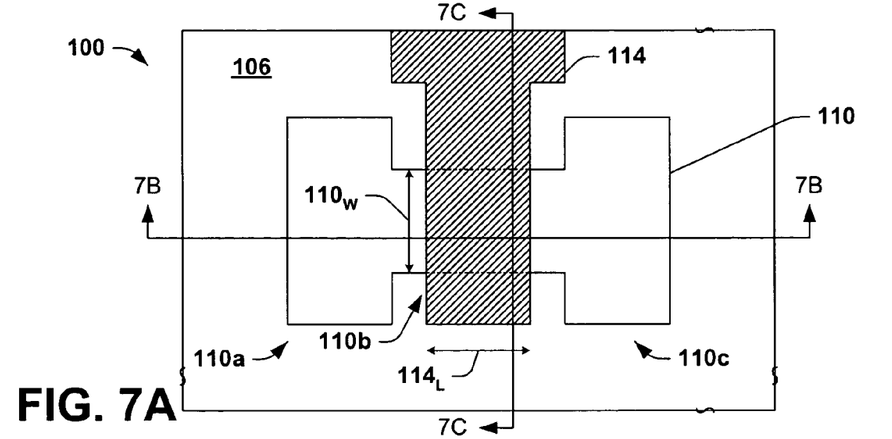
Figure 7B:
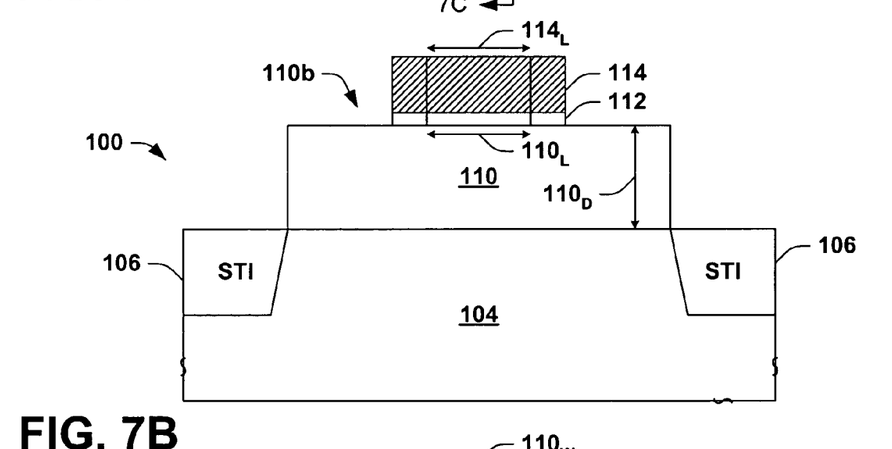
Figure 7C:
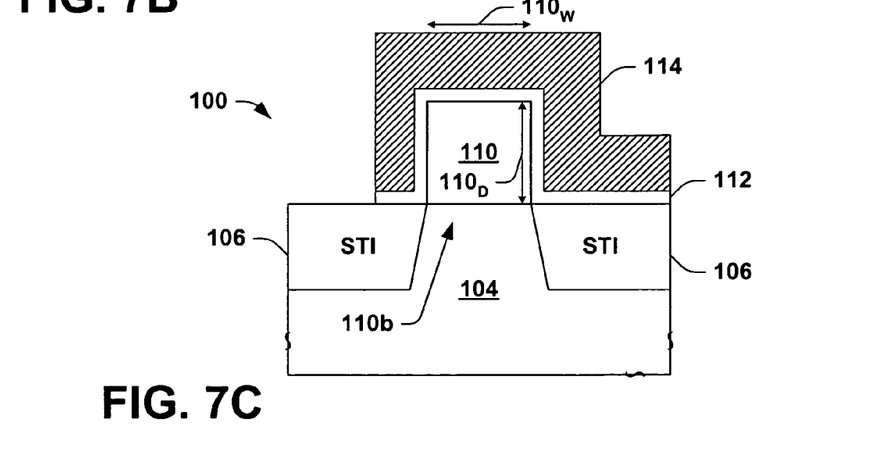
Figure 8A:
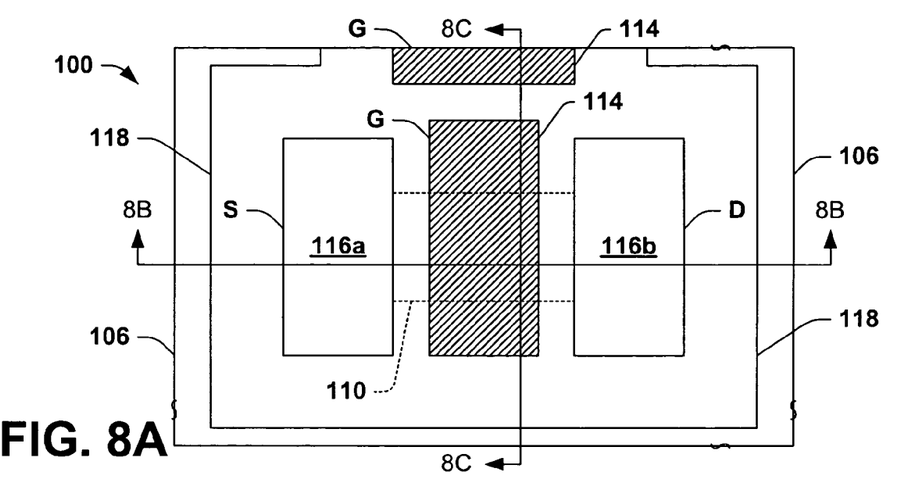
Figure 8B:
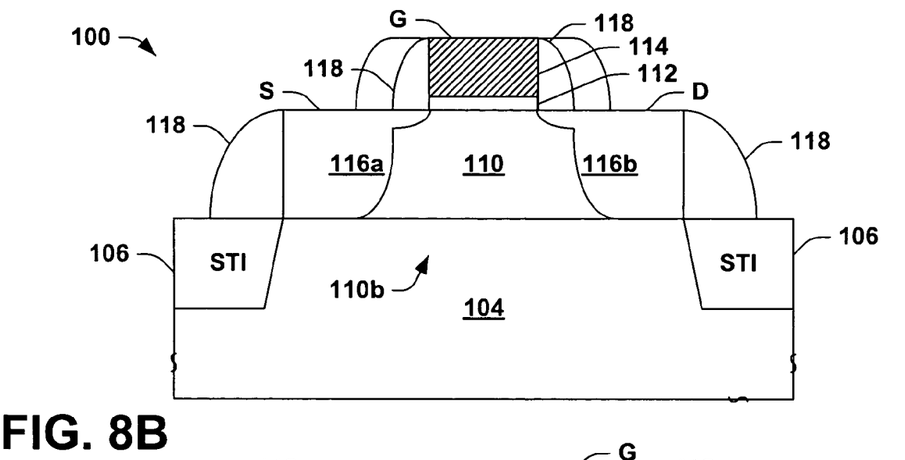
Figure 8C:
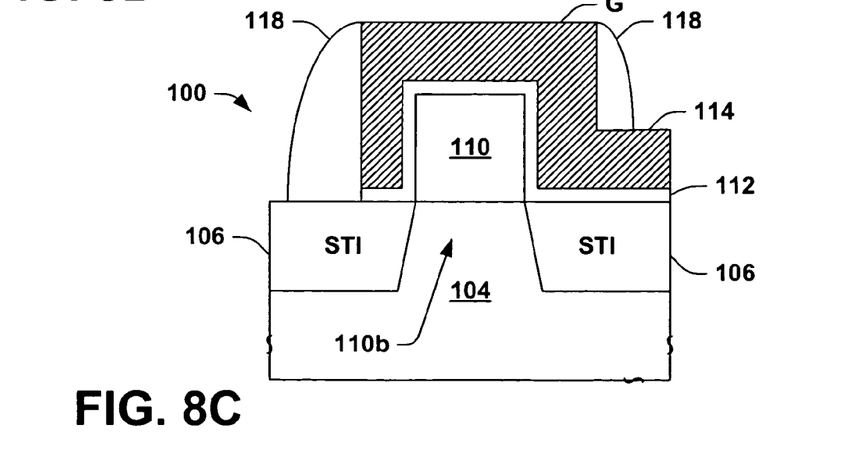

Referring now to FIGS. 5A–7C, the form structure 108 is then removed, for example, by wet etching or other process, leaving the formed semiconductor body 110 disposed above the starting structure as shown in FIGS. 5A–5C. In FIGS. 6A–6C, a gate oxide 112 is formed over the formed semiconductor body 110 via an oxidation growth or deposition process. A gate electrode material layer 114 (e.g., polysilicon, metal, or other suitable material) is then deposited above the gate dielectric 112. A gate etch is then performed as shown in FIGS. 7A–7C to remove portions of the gate electrode material 114 from the first and third body portions 110a and 110c, respectively, and also to remove the material 114 over part of the second body portion 110b. The gate etch may, but need not, remove portions of the gate dielectric 112. In the exemplary device 100, the gate etch leaves a patterned triple-gate structure having a gate length $114_L$ roughly corresponding to the channel length $110_L$, the channel structure width $110_W$, and the channel structure depth $110_D$ (e.g., about 25 nm or less).

Referring also to FIGS. 8A–9C, source/drain regions 116a and 116b are doped with n or p-type dopant species (e.g., depending upon whether an NMOS or PMOS transistor is being constructed) in the first and third body portions 110a and 110b, respectively, wherein the source/drain 116a is indicated as a source "S" and the source/drain 116b is indicated as a drain "D" in the figures. The source/drains 116a and 116b are formed by a shallow drain extension dopant implantation to introduce dopants into source/drain regions 116, followed by formation of sidewall spacers 118 along the lateral sidewalls of the patterned gate structure (indicated as "G" in the figures). The source/drains 116a and 116b are further defined by a source/drain implant to provide additional dopants to the source/drain regions 116a and 116b following formation of the sidewall spacers 118. The drain-extension implant and/or the source/drain implant may also provide dopants to the patterned gate electrode material 114 in the case of a polysilicon gate, to increase the conductivity of the gate electrode 114.

Figure 9A:
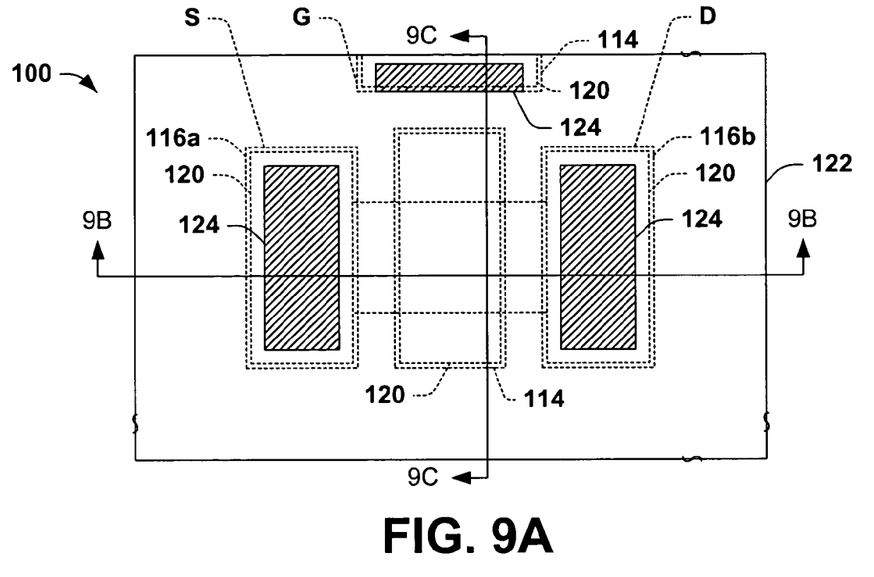
Figure 9B:
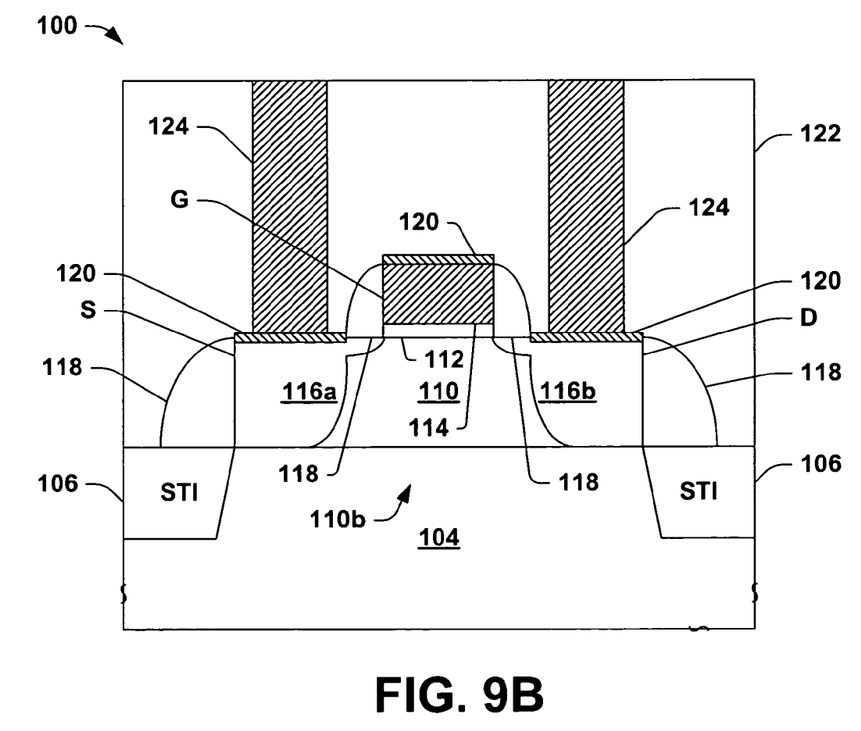
Figure 9C:
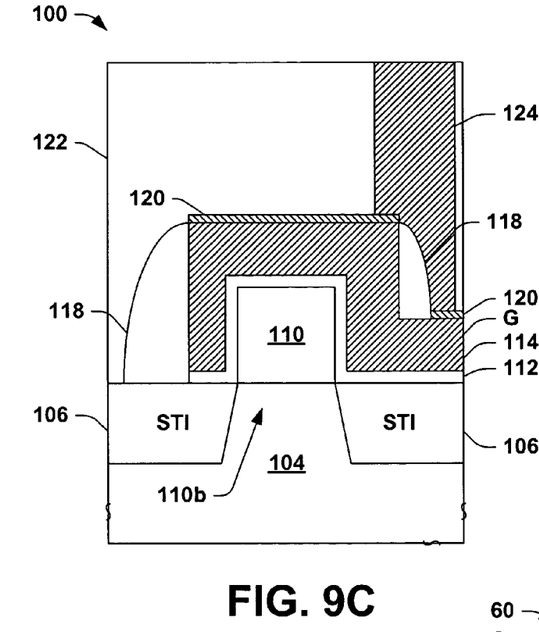

As illustrated in FIGS. 9A–9C, silicide 120 is then formed over the patterned gate electrode 114 as well as over the source/drains 116a and 116b via any suitable silicidation processing, for example, by depositing nickel over the device 100 and annealing, followed by removal of unreacted nickel. Interconnect metalization and other back-end processing is then performed to deposit a pre-metal dielectric (PMD) 122 and to form source, drain, and gate contacts 124 through the PMD material 122, after which further metalization (interconnect) processing is performed to complete the device 100.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a MOS transistor, the method comprising:
    creating a form structure above a starting structure, the form structure having an opening exposing a single portion of the starting structure;
    forming a semiconductor material in the opening of the form structure to create a formed semiconductor body having a single generally planar bottom surface above the starting structure, the formed semiconductor body comprising a first body portion, a second body portion, and a third body portion, the second body portion being disposed between the first and third body portions and having first and second sides and a top;
    removing the form structure;
    forming a gate structure disposed along at least a portion of the top and sides of the second body portion, the gate structure comprising a conductive gate electrode and a gate dielectric disposed between the gate electrode and the second body portion; and
    doping the first and third body portions to form source/drains in the first and third body portions.

2. The method of claim 1, wherein forming the semiconductor material in the opening of the form structure comprises:
    depositing the semiconductor material over the form structure and in the opening of the form structure; and
    planarizing the semiconductor material to expose the form structure.

3. The method of claim 2, wherein the starting structure comprises a semiconductor and wherein depositing the semiconductor material comprises depositing epitaxial silicon, epitaxial silicon germanium, epitaxial germanium, or epitaxial gallium arsenide over the form structure and in the opening of the form structure.

4. The method of claim 2, wherein depositing the semiconductor material comprises depositing epitaxial silicon over the form structure and in the opening of the form structure.

5. The method of claim 2, wherein the form structure comprises silicon nitride.

6. The method of claim 1, forming the semiconductor material in the opening of the form structure comprises forming silicon, silicon germanium, germanium, or gallium arsenide in the opening of the form structure.

7. The method of claim 1, wherein forming the semiconductor material comprises forming silicon in the opening of the form structure.

8. The method of claim 1, wherein the form structure comprises silicon nitride.

9. The method of claim 1, wherein creating the form structure comprises:
    depositing a form layer material above the starting structure; and
    selectively removing portions of the form layer material to create the opening exposing the single portion of the starting structure.

10. The method of claim 1, wherein forming the gate structure comprises:
    forming a gate dielectric material over the formed semiconductor body;
    forming a conductive gate electrode material above the gate dielectric material; and
    selectively removing the gate electrode material over the first and third body portions of the formed semiconductor body to define a gate structure disposed along at least a portion of the top and sides of the second body portion.

* * * * *